United States Patent [19]

Akiyama

[11] Patent Number: 5,327,363
[45] Date of Patent: Jul. 5, 1994

[54] PATTERN MEMORY CIRCUIT FOR INTEGRATED CIRCUIT TESTING APPARATUS

[75] Inventor: Tsutomu Akiyama, Tokyo, Japan

[73] Assignee: Ando Electric Co., Ltd., Tokyo, Japan

[21] Appl. No.: 852,446

[22] Filed: Mar. 16, 1992

[30] Foreign Application Priority Data

Mar. 25, 1991 [JP] Japan ................................. 3-084732

[51] Int. Cl.⁵ ...................... G05B 19/02; G11C 7/00; G11C 8/00
[52] U.S. Cl. .................................. 364/580; 371/21.1; 371/21.2; 371/21.3; 371/3
[58] Field of Search .................... 371/21.1, 21.3, 21.2, 371/3; 395/425

Primary Examiner—Jack B. Harvey
Assistant Examiner—Kamini Shah
Attorney, Agent, or Firm—Panitch Schwarze Jacobs & Nadel

[57] ABSTRACT

A pattern memory circuit for an integrated circuit testing apparatus. The time consumed for diagnosis in the conventional testing apparatus which uses a CPU is reduced by performing test pattern memory checking using hardware in accordance with the present invention. The test pattern file in a pattern memory escapes from the area to be tested to another area of the pattern memory and the test is performed and upon completion of the test the file returns to the original area.

4 Claims, 6 Drawing Sheets

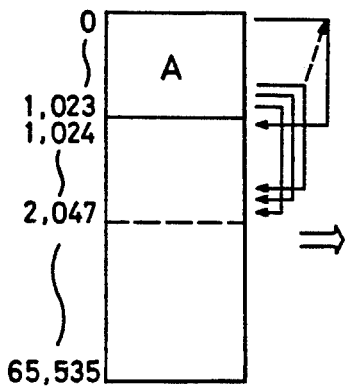
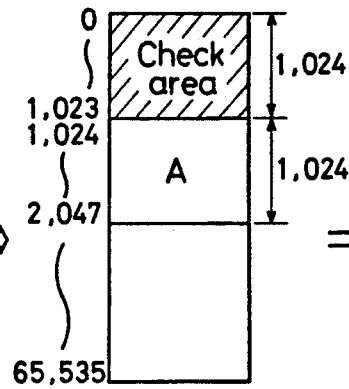
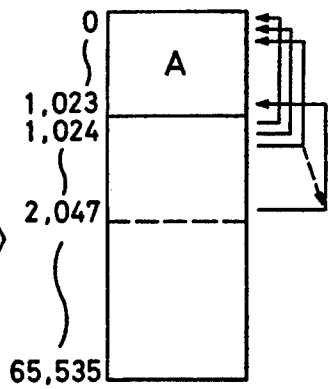
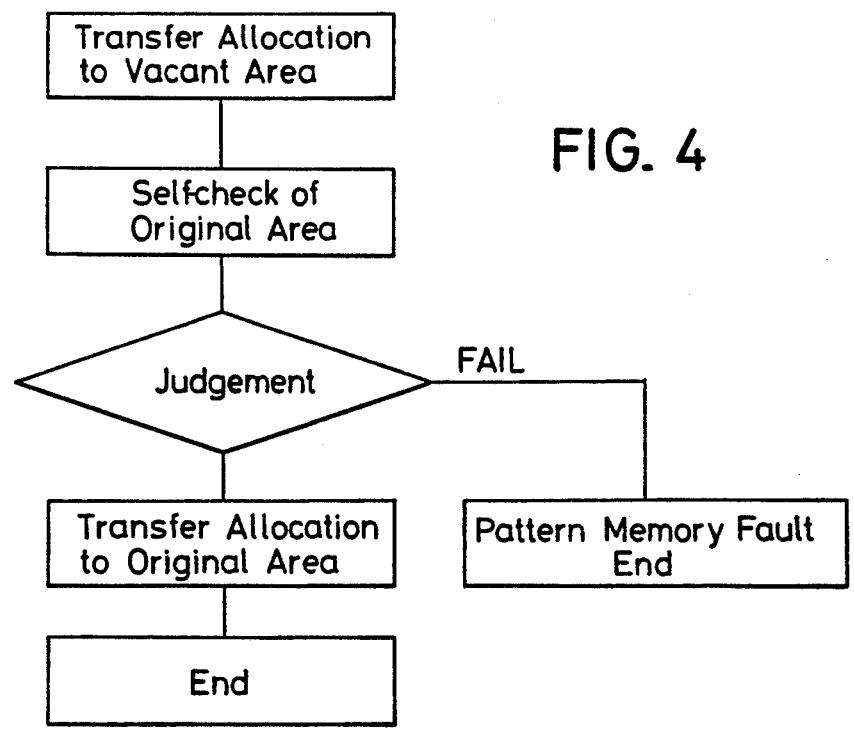

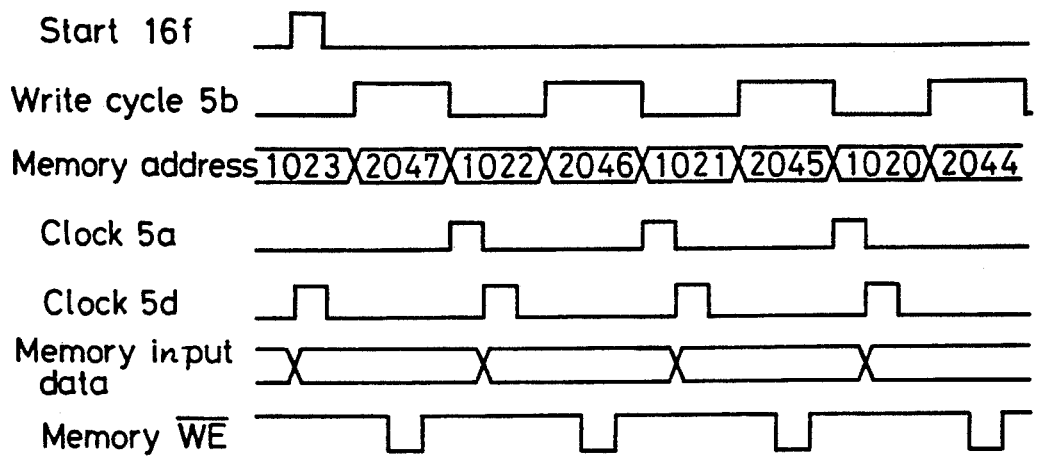
FIG. 5A  Transfer allocation to vacant area
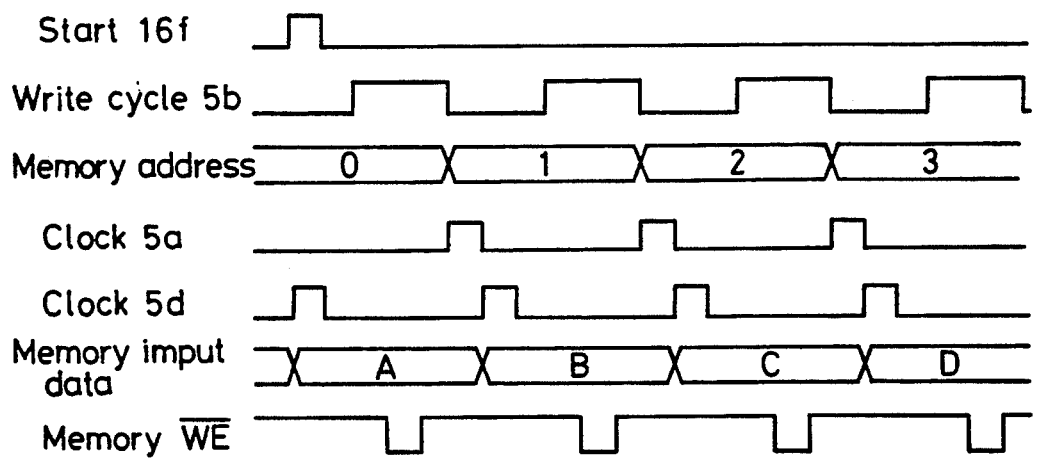
FIG. 5B  Write mode, selfcheck

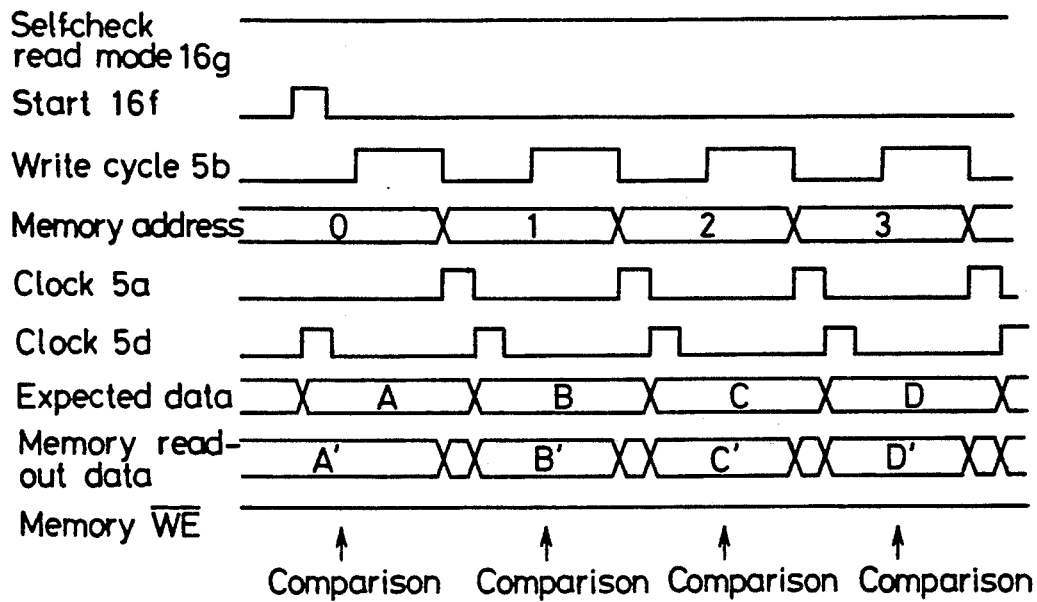
FIG. 5C  Read mode, selfcheck
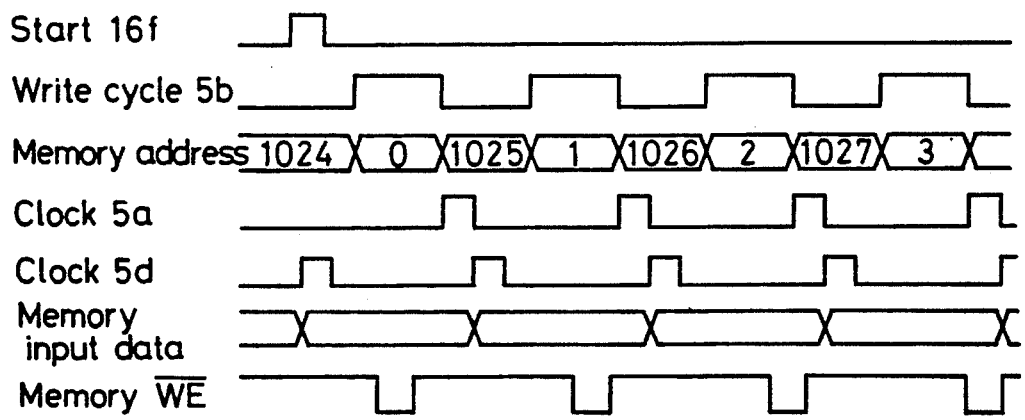
FIG. 5D  Transfer allocation to original area

PATTERN MEMORY CIRCUIT FOR INTEGRATED CIRCUIT TESTING APPARATUS

BACKGROUND OF THE INVENTION

1. The Field of the Invention

The present invention relates to a pattern memory circuit for an integrated circuit testing apparatus.

2. Prior Art

When a fault in an integrated circuit testing apparatus, especially a functional fault as appearing as an abnormalcy in the waveform of its input or output signal, is found, the test is interrupted and the abnormalcy is checked by using an independent sequence program for checking pattern memory operation. However, as the contents of the test pattern are rewritten by the memory checking it is required to cause the actual test pattern data to take temporary shelter to a CPU and, after completion of the memory check, the test pattern data are transferred back to the test pattern memory.

Next, a construction of the conventional pattern memory circuit for integrated circuit testing apparatus will be described by making reference to FIG. 6. In this figure, 1 is CPU, 2 is an address generating circuit, 3 is a data generating circuit, 9 is a comparator and 11 is a pattern memory.

In operation of the pattern memory circuit of FIG. 6, a sequence program for memory checking is written in the CPU 1 beforehand and, during a write mode, any desired address is given from the CPU 1 to the address generating circuit 2. The address generating circuit 2 receives the given address and supplies it to input terminal of the pattern memory 11. The data generating circuit 3 receives a data from the CPU 1 and supplies it to a data input terminal of the pattern memory 11. The data is written in the pattern memory 11 at the designated address.

Next, during a read mode, a desired address of the pattern memory 11 from which the data is to be read out is given from the CPU 1 to the address generating circuit 2, which, in turn, gives the address to the pattern memory 11 as an address input. The pattern memory read out a date from the given address and sends it to the comparator 9. The data generating circuit 3 is given an expected data from the CPU 1 and sends it to the the comparator 9, in which the output data of the pattern memory and the expected data are compared with each other and the comparator makes a decision as to whether the pattern memory 11 is consistent or not.

PROBLEM TO BE SOLVED

In the conventional testing apparatus, in order to perform the checking of the stored memory area without destroying the pattern data in it, it is required for the pattern data to temporarily escape from the pattern memory 11 to the tester computer and return to the pattern memory 11 after completion of the memory checking. In addition, the operation requires a time owing to the fact that the confirmation of the operation of the pattern memory 11 is controlled by a software program.

OBJECT OF THE INVENTION

Accordingly, it is a principal object of the present invention to eliminate the time required for the transfer of the pattern file between the CPU and the pattern memory and to reduce the time required for the diagnosis, when the pattern memory is checked as to whether there is any fault in an integrated circuit testing apparatus.

MEANS TO SOLVE THE PROBLEM

To achieve this object, the present invention provides a pattern memory circuit for an integrated circuit testing apparatus, which comprises:

a CPU into which a sequence program for diagnosis is written;

an address generating circuit for generating read addresses for reading a pattern memory during an allocation mode for transfer of a pattern file stored in the pattern memory to other memory addresses, and for generating read and write addresses during a self-check mode for diagnosis of the pattern memory;

an address/data generating circuit for generating write addresses during the allocation mode and for generating write data and expected data for the read data from the pattern memory during the self-check mode;

an end detection circuit for detecting completion of the allocation and self-check operation mode to generate end signals to stop the operation of a control circuit and notify the CPU of the completion, respectively;

the control circuit being actuated by a start signal from the CPU to generate control signals for the allocation and the self-check modes;

a first selector receiving an output of the address generating circuit as a first input and receiving an output of the address/data generating circuit as a second input;

a second selector receiving read data from the pattern memory as a first input and receiving the output of the address/data generating circuit as a second input;

a first flip-flop receiving an output of the second selector as an input;

the pattern memory receiving an output of the first flip-flop as data input and receiving an output of the first selector as an address input;

a comparator receiving the read data from the pattern memory as a first input and receiving the output of the first flip-flop as a second input, the comparator for comparing the first and the second inputs and judging the normal/fault condition of the pattern memory; and a second flip-flop receiving an output of the comparator as a set signal and receiving a start signal from the CPU as a reset signal.

The first and second selectors are operative to select the respective first inputs in the write mode allocation mode and the respective second inputs in the self-check mode.

BRIEF EXPLANATION OF THE DRAWINGS

FIGS. 3A–3C are an explanatory view for confirming the memory operations;

FIG. 4 is a flow chart of the diagnosis according to FIG. 3;

FIGS. 5A–5D show timing charts of the respective operations;

EXPLANATION OF THE PREFERRED EMBODIMENT

Figure 1:
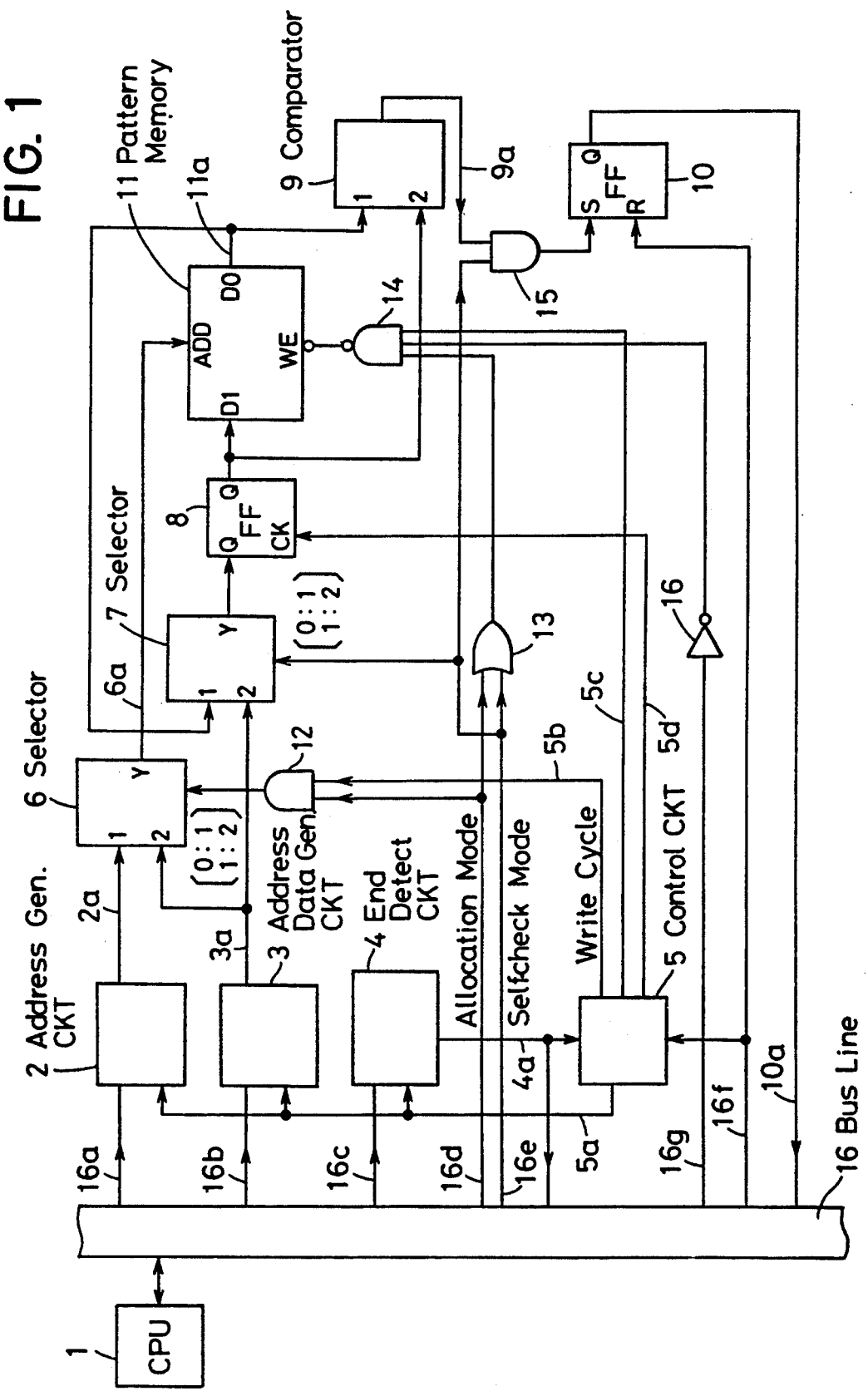
FIG. 1 illustrates an embodiment of the pattern memory circuit for an integrated circuit testing apparatus according to the present invention.

The present invention will now be explained in greater detail in connection with a preferred embodiment of pattern memory circuit for an integrated circuit testing apparatus by making reference to FIGS. 1 through 5, in which 1 is a CPU (central processing unit) 1, 2 is a address generating circuit, 3 is an address/data generating circuit, 4 is an end detect circuit, 5 is a control circuit, 6 and 7 are selectors, 8 is a flip-flop (FF), 9 is a comparator, 10 is a flip-flop and 11 is a pattern memory.

The CPU 1 has a sequence program for diagnosis of the pattern memory 11 written therein. The address generating circuit 2, under direction of the CPU 1, generates read addresses for reading data in the pattern memory 11 during an allocation mode for transfer of a pattern file stored in the pattern memory 11 to another set of memory addresses. The address generating circuit 2 also generates read and write addresses during a self-check mode for diagnosis of the pattern memory 11. The address/data generating circuit 3 is operative to generate write address during the allocation mode and for generating write data or expected data for the data read out from the pattern memory 11 during the self-check mode. The end detection circuit 4 detects completion of the allocation and self-check operation during the allocation mode and the self-check mode, respectively, to stop the operation of the control circuit 5 and notify the CPU 1 of the completion. The control circuit 5 is operative to start, upon receipt of a start signal 16$f$ from the CPU 1, to generate control signals for the allocation and the self-check operations. The first selector 6 receives to its first input terminal the output 2$a$ of the address generating circuit 2 and to its second input terminal the output 3$a$ of the address/data generating circuit 3. The first input is selected in the allocation mode and the second input is selected in the self-check mode as will be made clear. The second selector 7 receives to its first input terminal the read data 11$a$ from the pattern memory 11 and receives to its second input terminal the output 3$a$ of the address/data generation circuit 3. The first input is selected in the allocation mode and the second input is selected in the self-check mode as will be made clear. The first flip-flop 8 receives to its input the output of the second selector 7. The pattern memory 11 receives to its data(DI) input terminal the output of the first flip-flop 8 and to its address-(ADD) input terminal the output of the first selector 6. The comparator 9 receives to its first input terminal the data 11$a$ read out from the pattern memory 11 and receives to its second input the output of the first flip-flop 8, compares the first and the second inputs and judges the normal/fault condition of the pattern memory 11 when they are coincident/not coincident. The second flip-flop 10 receives to its set signal terminal the output of the comparator and receives to its reset signal terminal the start signal 16$f$ from the CPU 1.

Assuming that an integrated circuit testing pattern file "A" having a size of 1 k bytes is stored in the addresses 0-1023 of the pattern memory 11 having a capacity of 64 k bytes, confirmation of the operation of the memories in these addresses 0-1023 will be explained. FIG. 3($a$) is an explanatory view of the transfer to a vacant area of the pattern memory. FIG. 3($b$) is an explanatory view of the pattern memory during self-check mode, and FIG. 3($c$) is an explanatory view of the transfer to the original area.

ALLOCATION TO VACANT AREA

Next, the flow of the diagnosis of FIG. 3 will be explained by making reference to FIG. 4. First of all, the file "A" stored in the addresses 0-1023 of the pattern memory 11 is transferred to vacant addresses 1024-2047. For this purpose, "1023" is set in the address generating circuit 2 by the input 16$a$, "2047" is set in the address/data generation circuit 3 by the input 16$b$ and "1023" is set in the end detection circuit 4 by the input 16$c$. The CPU 1 sends an allocation mode signal 16$d$ to an AND gate 12.

Then, the CPU 1 outputs a start command 16$f$ to actuate the control circuit 5. The control circuit 5 issues clock signals 5$a$, 5$c$ and 5$d$ and a write cycle signal 5$b$. The clock 5$a$ is fed to the address generating circuit 2, address/data generating circuit 3 and end detection circuit 5, whereby, upon receipt of each clock, the address generating circuit 2 and the address/data generating circuit 3 add $-1$ to the set addresses, respectively, and the end detection circuit 4 counts down the set address by 1. When the count of the end detection circuit reaches "0" the allocation is deemed to have been completed and a stop signal 4$a$ is sent to the control circuit 5 and the CPU 1.

The control circuit 5, upon receipt of the stop signal 4$a$, stops generation of the clocks and the write cycle signal.

The selector 6 selects the output 2$a$ of the address generating circuit 2 by the output of the AND gate 12 during the read cycle of the pattern memory 11. On the other hand, the selector 6 selects the output 3$a$ of the address/data generating circuit 3 during the write cycle of the pattern memory 11 and inputs it to the pattern memory as an input address. The selector 7 always selects the read out data from the pattern memory 11 during the allocation mode and hands them to the FF8.

The FF8 is given an output clock 5$d$ as its clock input and passes the data to the pattern memory 11 as an input data as well as to the comparator 9 as its second input. The pattern memory 11 is given the output clock 5$c$ as a WE signal to write the data therein. In such way, the pattern file "A" stored in the pattern memory is transferred to the addresses 1024-2047.

SELF-CHECK OF THE ORIGINAL AREA

Thereafter, the original address area, the addresses 0 to 1023, is checked. To this end, the address generating circuit 2 is set at "0" and the end detection circuit 5 is set at "1023". The address/data generating circuit 3 is given a test data, i.e. the input data 16$b$. For example, if it is to check to know whether "0" is written and properly read, "0" is set in this circuit 3 and if it is to check to know whether "1" is written and properly read, "1" is set in this circuit 3.

The CPU 1 does not issue the allocation mode signal 16$d$ any longer and the selector 6 selects the first input. The CPU 1 issues a self-check mode signal 16$e$ and the selector 7 selects the second input.

A start command 16$f$ from the CPU 1 resets the FF 10 and actuates the control circuit 5 as well. The FF 8 takes in data by the output 5$d$ of the control circuit 5 and sends it to the pattern memory 11. Also, the output 5$c$ is given to the WE terminal of the pattern memory 11, enabling the data to be written in the pattern memory 11. The output 5a is given to the address generator 2, the address/data generating circuit 3 and the end detection circuit 4 as a clock, thereby changing the addresses by +1, and the data by +1 or −1 or maintaining the previous data.

Cycling of these outputs 5a, 5c and 5d permits the test data to be written in the pattern memory 11 with the hardware. At the same time, the end detection circuit 4 counts down the set address by the output 5a until count "0" is reached, upon which the test is deemed to have been completed and a stop signal 4a is supplied to the control circuit 5 which, in turn, stops generation of the clock and write cycle signals. Thus, the test data is written in the addresses 0–1023 of the pattern memory 11.

Thereafter, data is read from the pattern memory 11 to check as to whether the test data is properly written in the pattern memory 11. Prior to this operation, various conditions are set. This setting conditions are the same as the those just prior to the writing of the test data in the addresses 0–1023 of the pattern memory 11.

Subsequent to the condition setting, a self-check read mode signal 16g is outputted and given to a gate 16, which inverts the signal and gives it to a gate 14. Accordingly, the gate 14 always outputs "1" and supplies it to the WE terminal of the pattern memory 11.

The pattern memory 11, similarly to ordinary memory ICs known to those skilled in the art, enters a read mode when "1" is given to the WE terminal and enters a write cycle when "0" is given to the WE terminal. Thus, the pattern memory is kept in the read cycle.

A start command from the CPU 1 resets the FF 10 which then actuates the control circuit 5. The control circuit 5 outputs a check and write cycle signal. The FF 8 takes in data by the output 5d and supplies them to the comparator as expected data. The pattern memory 11 is read by the output addresses of the address generating circuit 2 and the read out data is given to the comparator 9. The comparator 9 compares the read out data from the pattern memory 11 with the expected data from the FF 8 to check their coincidence or discrepancy. If they are not coincident, a discrepancy signal is supplied to the set input of the FF 10, which is then set and outputs a fault signal 10a to the CPU 1.

The control circuit 5 generates clock 5a, 5c and 5d and write cycle signal 5b in a similar manner to the pattern memory write cycle and, accordingly, the address generating circuit 2 and the address/data generating circuit 3 output the same address and data as did during the pattern memory writing. In such manner, the self-check or diagnosis is carried out with the progress of the cycle of the outputs 5a, 5c and 5d and the write cycle signal 5b of the control circuit 5.

ALLOCATION BACK TO THE ORIGINAL AREA

After completion of the test, if the FF 10 is not issuing any fault signal, the pattern memory is normal and the previously sent pattern file "A" is returned to the original area. This is done in the same way as in the transfer from the pattern memory, except that the address generating circuit 2 is set at "1024", the address/data generating circuit 3 is at "0" and the end detecting circuit 4 is at "1023".

Further, the address generating circuit 2 and the address/data generating circuit 3 change their addresses by "+1" by the clock 5a and the end detecting circuit 4 counts down. Upon reaching "0" it is deemed that the allocation has been completed and a stop signal 4a is sent therefrom to the control circuit 5 as well as the CPU 1. In such manner, the pattern file "A" is transferred to the addresses "0–1023", thereby to reinstate the original condition.

Next, timing charts are depicted in FIG. 5, in which (a) explains the transfer allocation to a vacant area, (b) the write mode self-check operation, (c) the read mode self-check operation and (d) the transfer allocation to the original area.

From the foregoing, according to the present invention, when a trouble happens to occur in an integrated circuit testing apparatus, the conventional operation, in which the pattern file is temporarily transferred to the CPU 1 and after completion of the diagnosis and then the pattern file is transferred back to the memory, is eliminated and the area of the pattern file can be self-checked by means of the hardware.

Figure 2:
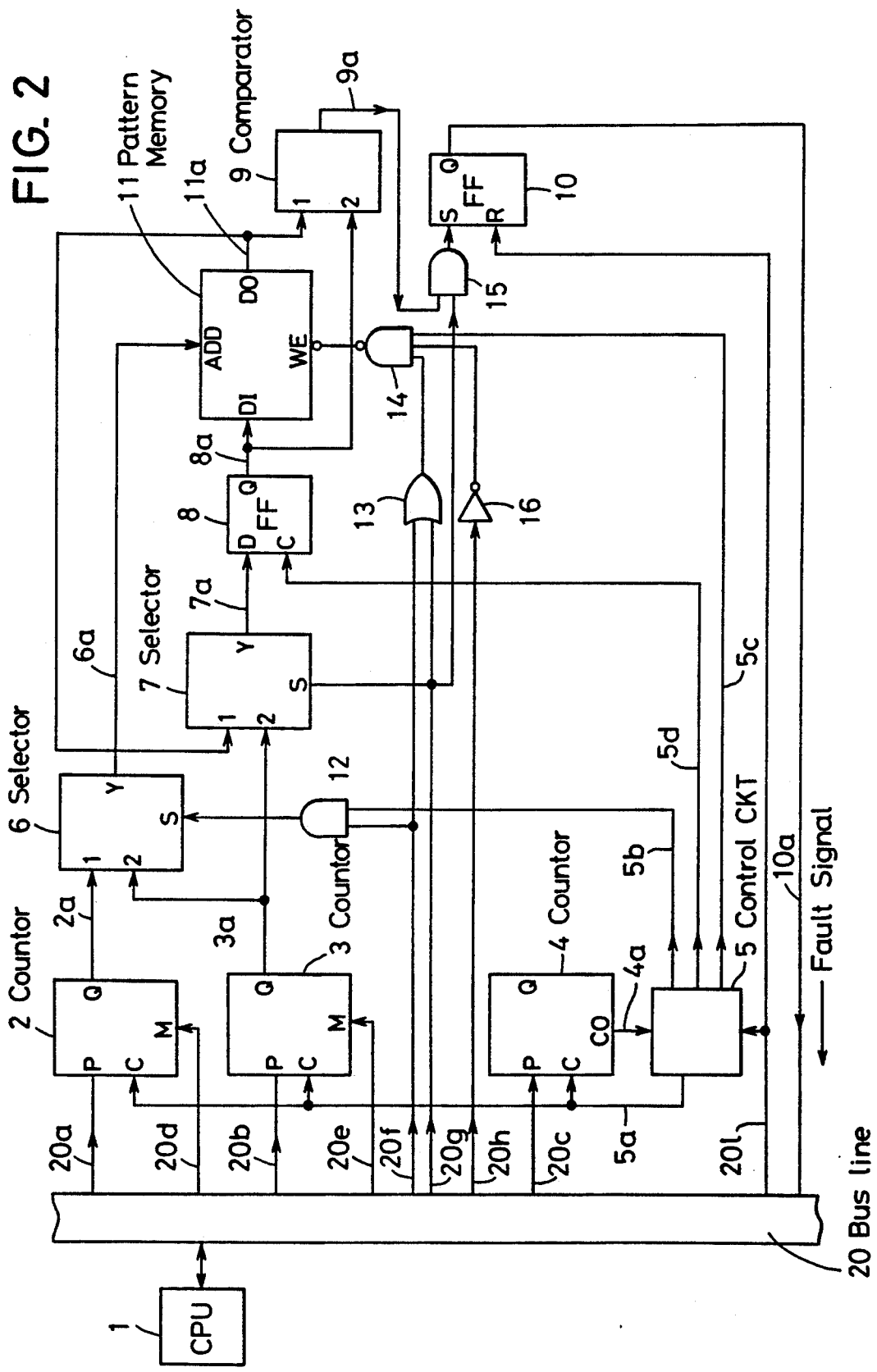
FIG. 2 is a more specific embodiment of the pattern memory circuit for an integrated circuit testing apparatus shown in FIG. 1.
Figure 6:
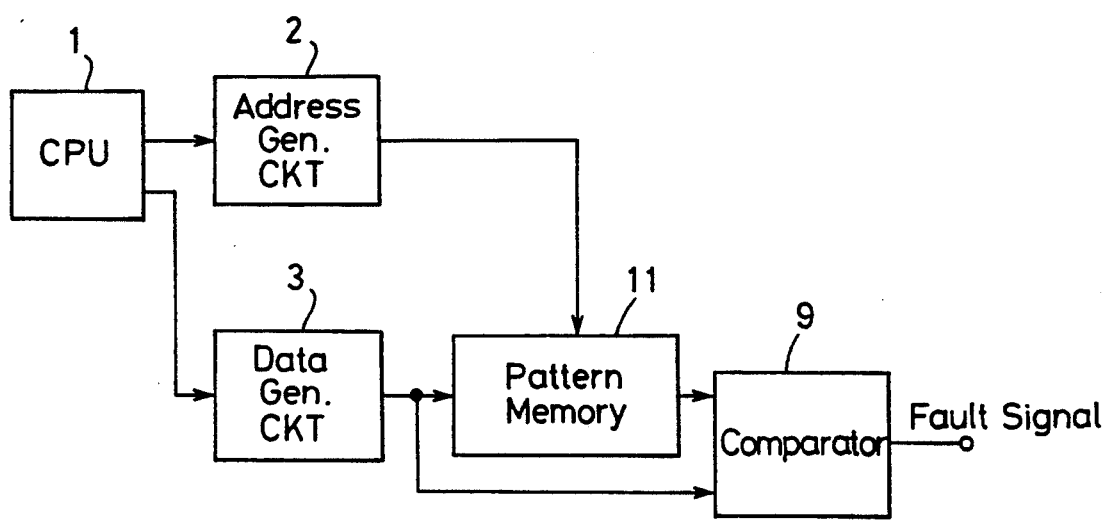
FIG. 6 illustrates a composition of the pattern memory circuit for an integrated circuit testing apparatus according to the present invention.

A more specific embodiment of the circuit shown in FIG. 1 is illustrated in FIG. 2 wherein the address generating circuit 2, the address/data generating circuit 3 and the end detecting circuit 4 are composed of counters 2, 3 and 4, respectively.

Referring to this drawing, a sequence program is written in the CPU 1 which is connected via a bus line 20 to the tester hardware. The counter 2 receives an address via an input line 20a and is put into an up-count or down-count mode by a mode signal 20d. The output 2a of this counter is supplied to the selector 6.

The counter 3 takes in an address or a data via an input data line 20b and is put into an up-count or down-count mode or data hold mode by a mode signal 20a and connected to the selectors 6 and 7. An allocation mode signal 20f is connected to the AND gate 12 and OR gate 13, the latter of which is, in turn, connected to the NAND gate 14. A self-check mode signal 20g is connected to the selector 7, the gate 13 and AND gate 15. The selector 7 is connected to a read-out data line 11a of the memory 11 and, by the self-check mode signal 20g, the counter 3a selects the output 3a of the counter 3 when the self-checking is carried out, while the selector 7 selects the output data 11a of the memory 11 when the allocation is carried out. The output 7a is connected to the FF 8.

A self-check read out mode signal 20h is a signal for putting the the pattern memory 11 into a read mode cycle. The signal 20h is connected to the inverting gate 16 and the inverted output of this gate 16 is connected to the gate 14. The counter 4 takes in the word number of the address area in question by the input data 20c in allocation and self-check modes.

A start command 20i is, upon start command for allocation and self-check, connected to the FF 10, which is, in turn, reset by this command. Also, the control circuit 5 is actuated by the start command 20i and outputs clocks 5a, 5c and 5d and write cycle signal 5b.

The clock 5a is sent to the counters 2, 3 and 4. The counter 2 changes by +1 or −1, the counter 3 changes by +1 or −1 or retains the previous condition, and the counter 4 performs down-counting. When the count of the counter 4 reaches "0", a stop signal 4a is sent to the control circuit 5 to stop control circuit 5.

The signal 5b from the control circuit is a select signal for the selector 6 in allocation operation and functions in such manner that during memory read mode the output 2a of the counter 2 is selected and during memory write mode the output 3a of the counter 3 is selected. The output 6a of the selector 6 is connected to the input address of the memory 11. The output 5d of the control 5 is connected to the FF8 which takes in the data 7a by this clock and its output 8a is connected to the memory 11 and the comparator 9. The output 5c of the control circuit 5 is a clock for memory writing and connected to the gate 14. The memory writing is effected by the output of this gate 14.

The memory read-out data 11a is connected to the comparator 9 and compared therein with the expected data 8a to determine the coincidence/discrepancy and if they differ from each other a discrepancy signal 9a is outputted. The output 9a is connected to the gate 15 which, in turn, passes the output 9a to the FF10 in the self-check operation. When set, the FF10 is outputs a fault signal 10a outputs, which is led to the CPU 1 by way of the bus line 20.

It should be noted that, when the vacant area in the pattern memory is smaller than the pattern file, the word number available in the vacant area may be used for allocation only for this word number, the test may be performed in the original pattern memory area and then the original area is restored and the similar process may be repeated. Thus, even if there is only one vacant row in the memory it is possible to perform the memory checking.

From the foregoing, since the present invention utilizes a system comprising a control circuit (or counter), an address generating circuit, address/data generation circuit (or counter), a test and allocation end detecting circuit (or counter), an address selector, a data selector, a data retaining flip-flop (FF), a comparator and fault bit register (FF), it has been made possible by the hardware that the pattern file is transferred to a vacant area within a pattern memory, the memory checking is then performed and the file is thereafter transferred back to the original area under the control of the clocks from the control circuit, whereby the checking time is significantly reduced. This is ain contrast to the time consuming conventional system wherein the pattern file must temporarily escape to the CPU, the memory checking is then performed by a program in the CPU, and the pattern file is thereafter transferred back to the original area.

What we claim is:

1. A pattern memory circuit for an integrated circuit testing apparatus, which comprises:
    a pattern memory having an address input, a data input, a read/write input, and a data output;
    a CPU in which a sequence program for diagnosis of the pattern memory is written, the CPU for generating a start signal, an allocation mode signal representing an allocation mode, a self-check signal representing a self-check mode, and a read enable signal;
    an address generating circuit having an address input from the CPU and an address output, and adapted to generate addresses of the pattern memory;
    an address/data generating circuit having an address/data input from the CPU and an address/data output, adapted to generate addresses of the pattern memory different from the addresses generated by the address generating circuit during the allocation mode, and adapted to generate data during the self-check mode;
    an end detection circuit having an end address input from the CPU and an end detect output, and adapted to detect completion of the operation of the address generating circuit to notify the CPU of the completion;
    a control circuit receiving the start signal from the CPU and the end detect signal from the end detection circuit, the control circuit being actuated by the start signal to generate a control signal for allowing operation of the address generating circuit, the address/data generating circuit, and the end detecting circuit, and to generate read and write cycle signals representing alternating read and write cycles;
    a first selector for selecting the address/data output of the address/data generating circuit during a write cycles during the allocation mode, and for otherwise selecting the address output of the address generating circuit, the selection being output as a signal to the address input of the pattern memory;
    a second selector for selecting the address/data output from the address/data generating circuit during the self-check mode, and for otherwise selecting the data output from the pattern memory, the selection being output as a signal to the data input of the pattern memory; and
    a comparator receiving signals from the data output and the data input of the pattern memory as inputs, the comparator adapted to compare data read from the pattern memory and data forwarded from the second selector during the self-check mode to determine coincidence therebetween, the comparator outputting a fault signal when coincidence is not determined;
    whereby, during a first allocation mode, data stored in the pattern memory is transferred from first addresses to second addresses within the pattern memory;
    whereby, after the first allocation mode and during the self-check mode, data from the address/data generating circuit is written into the first addresses during absence of a read enable signal from the CPU, and the data in the pattern memory is read out during presence of a read enable signal from the CPU and compared in the comparator with the data from the address/data generating circuit previously written in; and
    whereby, after the self-check mode and during a second allocation mode, the data in the second addresses is transferred back to the first addresses.

2. A pattern memory circuit for an integrated circuit testing apparatus according to claim 1, wherein, in the allocation mode, the first selector selects the address output of the address generating circuit during the presence of a read enable signal from the CPU and the address/data output of the address/data generating circuit during the absence of a read enable signal from the CPU, and the second selector selects the data output of the pattern memory.

3. A pattern memory circuit for an integrated circuit testing apparatus according to claim 1, wherein, in the self-check mode, the first selector selects the address output of the address generating circuit both during the presence and absence of a read enable signal from the CPU and the second selector selects the address/data output of the address/data generating circuit during the absence of a read enable signal from the CPU.

4. A pattern memory circuit for an integrated circuit testing apparatus according to claim 1, wherein, in the allocation mode, the first selector selects the address output of the address generating circuit during the presence of a read enable signal from the CPU and the address/data output of the address/data generating circuit during the absence of a read enable signal from the CPU, and the second selector selects the data output of the pattern memory and, in the self-check mode, the first selector selects the address/data output of the address/data generating circuit both during the presence and absence of a read enable signal from the CPU, and the second selector selects the address output of the address generating circuit during the absence of a read enable signal from the CPU.

* * * * *